US010756700B2

(12) United States Patent
Han et al.

(10) Patent No.: US 10,756,700 B2
(45) Date of Patent: Aug. 25, 2020

(54) BULK ACOUSTIC WAVE RESONATOR DEVICE

(71) Applicant: Samsung Electro-Mechanics Co., Ltd., Suwon-si (KR)

(72) Inventors: Sung Han, Suwon-si (KR); Jae Chang Lee, Suwon-si (KR); Won Han, Suwon-si (KR); Tae Yoon Kim, Suwon-si (KR); Jong Woon Kim, Suwon-si (KR); Tae Kyung Lee, Suwon-si (KR); Moon Chul Lee, Suwon-si (KR); Tae Hun Lee, Suwon-si (KR); Sung Min Cho, Suwon-si (KR); In Young Kang, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 622 days.

(21) Appl. No.: 15/638,809

(22) Filed: Jun. 30, 2017

(65) Prior Publication Data

US 2018/0019726 A1     Jan. 18, 2018

(30) Foreign Application Priority Data

Jul. 14, 2016   (KR) ........................ 10-2016-0089394
Apr. 10, 2017   (KR) ........................ 10-2017-0046259

(51) Int. Cl.
    *H01L 41/09*       (2006.01)
    *H03H 9/10*        (2006.01)
    (Continued)

(52) U.S. Cl.
    CPC ...... *H03H 9/1014* (2013.01); *H03H 9/02086* (2013.01); *H03H 9/02102* (2013.01);
    (Continued)

(58) Field of Classification Search
    CPC ............ H03H 9/1014; H03H 9/02086; H03H 9/02102; H03H 9/02118; H03H 9/02157; H03H 9/172; H03H 9/173; H03H 9/54
    (Continued)

(56) References Cited

U.S. PATENT DOCUMENTS 9,893,270 B2 *   2/2018   Araki ........................ H03H 3/02
2004/0256961 A1 *  12/2004   Namba .................... H03H 3/04
                                                   310/365

(Continued)

FOREIGN PATENT DOCUMENTS

CN     102301590 A     12/2011
CN     103534943 A      1/2014
(Continued)

OTHER PUBLICATIONS

Chinese Office Action dated Mar. 25, 2020 in counterpart of Chinese Patent Application No. 201710564872.4 (11 pages in English and 7 pages in Chinese).

*Primary Examiner* — Thomas M Dougherty
(74) *Attorney, Agent, or Firm* — NSIP Law (57) ABSTRACT

A bulk acoustic wave resonator device includes: a substrate; a lower electrode disposed on the substrate; a piezoelectric layer disposed over a portion of the lower electrode; an upper electrode disposed on the piezoelectric layer; and a shape control layer covering an edge of a cavity disposed between the substrate and the lower electrode, wherein tensile stress is applied to the shape control layer during formation of the shape control layer.

24 Claims, 3 Drawing Sheets

(51) Int. Cl.
  *H03H 9/02* (2006.01)
  *H03H 9/54* (2006.01)
  *H03H 9/17* (2006.01)

(52) U.S. Cl.
  CPC .... *H03H 9/02118* (2013.01); *H03H 9/02157* (2013.01); *H03H 9/172* (2013.01); *H03H 9/173* (2013.01); *H03H 9/54* (2013.01)

(58) Field of Classification Search
  USPC .................................................. 310/311–371
  See application file for complete search history.

(56) References Cited

U.S. PATENT DOCUMENTS

| | | | |
|---|---|---|---|
| 2008/0042780 A1* | 2/2008 | Lee | H03H 3/02 333/187 |
| 2011/0298564 A1 | 12/2011 | Iwashita et al. | |
| 2012/0182090 A1 | 7/2012 | Pang et al. | |
| 2013/0127300 A1 | 5/2013 | Umeda et al. | |
| 2014/0191617 A1* | 7/2014 | Ohashi | H03H 9/1092 310/348 |
| 2014/0203686 A1* | 7/2014 | Song | H01L 41/314 310/326 |

FOREIGN PATENT DOCUMENTS

| | | |
|---|---|---|
| CN | 103858342 A | 6/2014 |
| JP | 2008-258799 A | 10/2008 |
| JP | 4685832 B2 | 5/2011 |
| JP | 2014-143531 A | 8/2014 |
| KR | 10-1099439 B1 | 12/2011 |
| WO | WO 2013/085136 A1 | 6/2013 |
| WO | WO 2013/108965 A1 | 7/2013 |

\* cited by examiner

BULK ACOUSTIC WAVE RESONATOR DEVICE

CROSS-REFERENCE TO RELATED APPLICATIONS

This application claims benefit of Korean Patent Application Nos. 10-2016-0089394 and 10-2017-0046259 filed on Jul. 14, 2016 and Apr. 10, 2017, respectively, in the Korean Intellectual Property Office, the entire disclosures of which are incorporated herein by reference for all purposes.

BACKGROUND

1. Field

The following description relates to a bulk acoustic wave resonator device.

2. Description of Related Art

A resonator is a device in which energy resonates at a certain frequency, and is used in a filter, an oscillator, or a frequency counter, for example. There are various structures for performing resonation using the resonator, but the use of a resonating structure using an acoustic wave has become increasingly common.

In the past, resonators using surface acoustic waves were most commonly used in the market. However, bulk acoustic wave resonators, which have electrodes with large acoustic impedance disposed on both sides thereof and a piezoelectric material disposed therebetween, in order to generate an acoustic wave in a thickness direction of the resonator, have rapidly become more prevalent in recent times. For example, bulk acoustic wave filters are commonly used in filter markers in a high frequency domain.

Recently, membrane-type resonators, which have a structure in which a cavity is formed below a resonating part, have been adopted. In a membrane-type resonator, mechanical and electrical characteristics deteriorate when friction between the resonating part and a substrate disposed below the cavity occurs. Since the resonating part and the substrate are closely in contact with each other at the time of manufacturing, there are problems in that frequency characteristics are deteriorated, as compared to normal frequency characteristics, and noise occurs across an overall region of the resonator.

Consequently, the development of a structure capable of suppressing the contact between the resonating part and the substrate disposed below the cavity is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator device includes: a substrate; a lower electrode disposed on the substrate; a piezoelectric layer covering a portion of the lower electrode; an upper electrode disposed on the piezoelectric layer; and a shape control layer disposed over an edge of a cavity disposed between the substrate and the lower electrode, wherein tensile stress is applied to the shape control layer during formation of the shape control layer.

The shape control layer may include any one of copper (Cu), nickel (Ni) and chromium (Cr), or a material containing any one of copper (Cu), nickel (Ni) and chromium (Cr).

The tensile stress may be applied to the shape control layer by applying heat or increasing a temperature of the substrate when the shape control layer is formed.

The shape control layer may include a polymer resin composite material.

The tensile stress may be applied to the shape control layer at the time of a heat treatment of either one of a drying operation and a curing operation.

The bulk acoustic wave resonator device may further include a first layer disposed on the substrate and forming the cavity together with the substrate.

The bulk acoustic wave resonator device may further include a protective layer covering a portion of the upper electrode.

A portion of the shape control layer may be disposed over the cavity, and remaining portions of the shape control layer may be disposed outside the cavity.

The shape control layer may not protrude outside the cavity.

The shape control layer may be disposed from a position corresponding to an edge of the cavity to a position corresponding to a central portion of the cavity.

The shape control layer may include a first shape control layer disposed on the lower electrode, and a second shape control layer disposed on the upper electrode.

Either one or both of the first shape control layer and the second shape control layer may be disposed on a top surface of the piezoelectric layer.

The substrate may include supporting parts supporting edges of a resonating part. The cavity may be disposed inside the supporting parts.

An overall thickness b of the lower electrode, the piezoelectric layer, and the upper layer, and a thickness a of the shape control layer disposed on either one of the upper electrode and the lower electrode may satisfy a conditional equation $0.1 \leq a/b \leq 3$.

A length c for which either one of the upper electrode and the lower electrode overlaps the shape control layer may satisfy a conditional equation $0.1 \leq c \leq 15$ μm.

A length d of the shape control layer disposed outside either one of the upper electrode and the lower electrode may satisfy a conditional equation $0.2 \leq d \leq 30$ μm.

A length e of the shape control layer disposed over the cavity may satisfy a conditional equation $0.1 \leq e \leq 15$ μm.

A height B of the cavity, which is a height of the cavity when there is no deflection of a resonating part of the bulk acoustic resonator device and a height A of the cavity, which is an increase in height of the cavity when a deflection of the resonating part occurs, may satisfy a conditional equation $0.002 \leq A/(A+B) \leq 0.8$.

A height B of the cavity, which is a height of the cavity when there is no deflection of a resonating part, and a height A of the cavity, which is an increase in height of the cavity when a deflection of the resonating part occurs, may satisfy a conditional equation $A/B < 1.0$.

A width C of a resonating part disposed over the cavity, and a height A of the cavity, which is an increase in height of the cavity when a deflection of the resonating part occurs, may satisfy a conditional equation in which $0 \leq A/C \leq 0.1$.

The lower electrode, the piezoelectric layer, and the upper electrode may deform to have an upwardly convex arch shape in response to the piezoelectric layer being deformed.

In another general aspect, a bulk acoustic wave resonator device includes: a substrate; a first layer disposed on the substrate and forming a cavity together with the substrate; a lower electrode disposed on the first layer; a piezoelectric layer covering a portion of the lower electrode; an upper electrode disposed on the piezoelectric layer; a protective layer covering a portion of the upper electrode; and a shape control layer disposed over an edge of the cavity, wherein tensile stress is applied to the shape control layer during formation of the shape control layer, and residual stress remains in the shape control layer.

In another general aspect, a bulk acoustic wave resonator device includes: a first layer disposed on a substrate, wherein a cavity is disposed between the substrate and the first layer; a lower electrode disposed on a portion of the first layer that covers the cavity in part; a piezoelectric layer disposed on a portion of the lower electrode; an upper electrode formed on the piezoelectric layer; and a shape control layer configured to cover a portion of the lower electrode at an end portion of the cavity and cover a portion of the upper electrode at another end portion of the cavity, wherein tensile stress is applied to the shape control layer during formation of the shape control layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
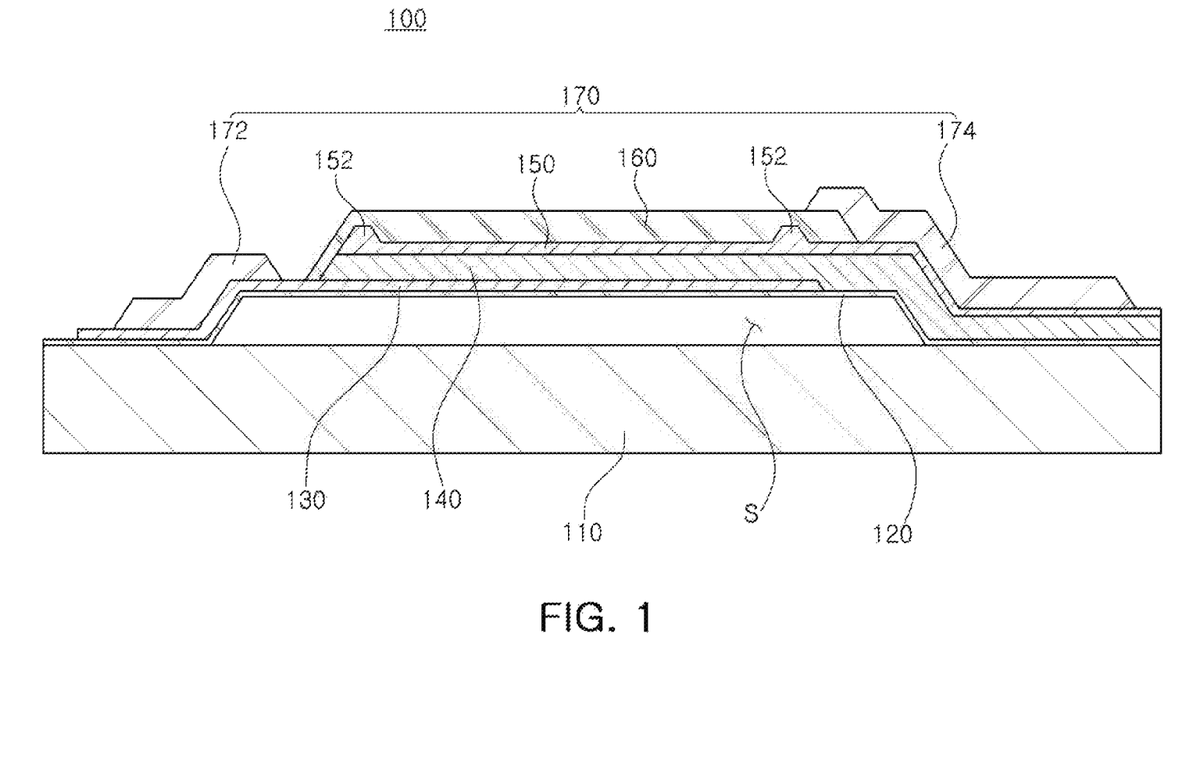
FIG. 1 is a schematic cross-sectional view illustrating a bulk acoustic wave filter device, according to an embodiment.

FIG. 1 is a schematic cross-sectional view illustrating a bulk acoustic wave resonator device 100, according to an embodiment. Referring to FIG. 1, the bulk acoustic wave resonator device 100 includes, for example, a substrate 110, a first layer 120, a lower electrode 130, a piezoelectric layer 140, an upper electrode 150, a protective layer 160, and a shape control layer 170.

The substrate 110 is a substrate on which silicon is stacked. For example, a silicon wafer is used as the substrate. In an example, a protective layer (not shown) for protecting the silicon is formed on a top surface of the substrate 110. That is, the protective layer is formed on the top surface of the substrate 110 to prevent etching of the substrate 110 when an operation of removing a sacrificial layer (not shown is performed to form a cavity S.

The first layer 120 is formed on the substrate 110 and the cavity S. That is, the first layer 120 is formed on the substrate 110 and the sacrificial layer so as to cover the sacrificial layer formed on the substrate 110 at the time of manufacturing. Thereafter, in a case in which the sacrificial layer is removed, the cavity S is formed below the first layer 120.

In an example, the first layer 120 is formed of silicon oxide ($SiO_2$) or a material containing silicon oxide ($SiO_2$). The first layer 120 prevents etching of a lower end portion of the lower electrode 130 when the operation of removing the sacrificial layer is performed.

The lower electrode 130 is formed on the first layer 120 and, as an example, the lower electrode 130 is formed so that at least a portion of the lower electrode 130 is disposed over the cavity S. The lower electrode 130 may be formed of a conductive material such as molybdenum (Mo), ruthenium (Ru), tungsten (W), iridium (Ir), or platinum (Pt), or an alloy of molybdenum (Mo), ruthenium (Ru), tungsten (W), iridium (Ir), or platinum (Pt).

In addition, the lower electrode 130 is used as either an input electrode that inputs an electric signal, such as a radio frequency (RF) signal, or an output electrode. For example, in a case in which the lower electrode 130 is the input electrode, the upper electrode 150 is the output electrode, and, in a case in which the lower electrode 130 is the output electrode, the upper electrode 150 is the input electrode.

The piezoelectric layer 140 covers at least a portion of the lower electrode 130. In addition, the piezoelectric layer 140 converts the electric signal input from the lower electrode 130 or the upper electrode 150 into an acoustic wave.

In an example, in a case in which an electric field that is changed over time is maintained in the upper electrode 150, the piezoelectric layer 140 converts the electric signal input from the upper electrode 150 into a physical vibration. In addition, the piezoelectric layer 140 converts the converted physical vibration into the acoustic wave. In this case, an electric field that is changed over time may be induced. As a result, the piezoelectric layer 140 generates a bulk acoustic wave in the same direction as a thickness vibration direction within the oriented piezoelectric layer 140 using the induced electric field.

As such, the piezoelectric layer 140 generates the bulk acoustic wave to convert the electric signal into the acoustic wave.

The piezoelectric layer 140 may be formed by depositing aluminum nitride, zinc oxide, or lead zirconate titanate on the lower electrode 130.

The upper electrode 150 is formed on the piezoelectric layer 140, and is formed of a conductive material such as molybdenum (Mo), ruthenium (Ru), tungsten (W), iridium (Ir), or platinum (Pt), or an alloy of molybdenum (Mo), ruthenium (Ru), tungsten (W), iridium (Ir), or platinum (Pt), by way of example. In addition, the upper electrode 150 is used as either an input electrode, that inputs an electric signal such as a radio frequency (RF) signal, or an output electrode, as described above.

Frame portions 152 are formed on the upper electrode 150, and the frame portions 152 reflect a lateral wave generated at the time of resonation into an active region of the bulk acoustic wave resonator device 100, to confine resonance energy to the active region.

The protective layer 160 covers at least a portion of the upper electrode 150. In an example, the protective layer 160 is formed on the upper electrode 150 so as to be disposed over the cavity S. In addition, the protective layer 160 prevents the upper electrode 150 from being damaged during the operation. Further, a thickness of the protective layer 160 may be adjusted by etching to adjust a resonant frequency of the bulk acoustic wave resonator device 100 in a final operation.

In addition, the protective layer 160 is also formed on all regions except for a region on which a metal pad (not shown) is formed.

The shape control layer 170 covers an edge of the cavity S. In addition, when the shape control layer 170 is formed, tensile stress may be applied to the shape control layer 170. Further, the shape control layer 170 may be formed so that residual stress exists.

In an example, the shape control layer 170 is formed of a metal material such as copper (Cu), nickel (Ni), or chromium (Cr), and is formed by separately applying heat after a stacking operation or by highly increasing a temperature of the substrate 110 at the time of a deposition operation to apply the tensile stress to the shape control layer 170.

In addition, the shape control layer 170 may be formed of a polymer resin composite material, and may be formed by applying the tensile stress to the shape control layer 170 at the time of a heat treatment, such as a drying or curing operation. Accordingly, the shape control layer has the residual stress.

Consequently, upward deflection is generated in corners of the resonating part (a part of the bulk acoustic wave resonator device 100 that is deformed and vibrated when the piezoelectric layer deforms). Therefore, downward deflection is generated in a central portion of the resonating part, to prevent the resonating part from being in contact with the substrate 110 in the region in which the cavity S is formed. Finally, an occurrence of a semi-permanent deformation due to the contact between the resonating part and the substrate 110 is prevented.

As such, a shape deformation of the resonating part is controlled, regardless of stress of the piezoelectric layer 140, the lower electrode 130, and the upper electrode 150, all of which are disposed in the resonating part.

The shape control layer 170 includes a first shape control layer 172 formed on the lower electrode 130, and a second shape control layer 174 formed on the upper electrode 150.

As described above, in a case in which the deformation occurs in the piezoelectric layer 140 through the shape control layer 170, a contact between a bottom surface of the resonating part and the substrate 110 may be prevented. Accordingly, an occurrence of a permanent deformation in which the bottom surface of the resonating part is maintained in contact with the substrate is prevented.

Although the embodiment of FIG. 1 does not illustrate a metal pad electrically connected to the lower electrode 130 and the upper electrode 150, the metal pad may be formed on the lower electrode 130 and the upper electrode 150, respectively.

Figure 2:
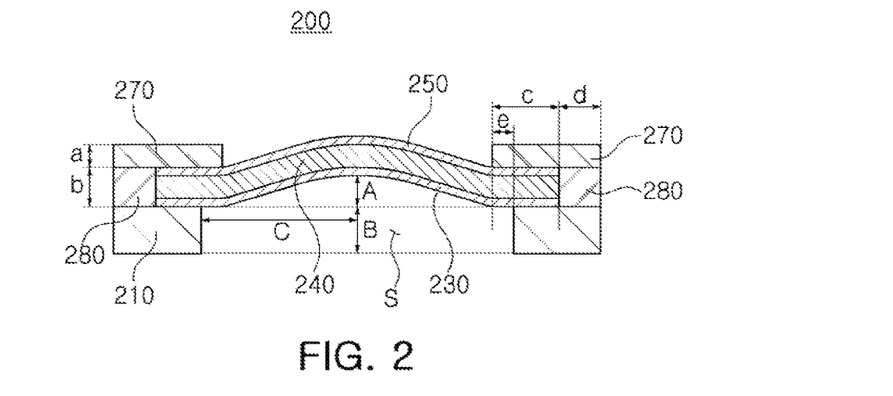
FIG. 2 is a view illustrating ratios and lengths of features included in a bulk acoustic wave resonator device, according to an embodiment.

FIG. 2 is a view illustrating ratios and lengths of features of a bulk acoustic wave resonator device 200, according to an embodiment. The bulk acoustic wave resonator device 200 includes a substrate 210, a lower electrode 230, a piezoelectric layer 240, an upper electrode 250, and a shape control layer 270.

According to an example, in the bulk acoustic wave resonator device 200, a ratio of a thickness a of the shape control layer 270, disposed over a resonating part, to a thickness b of the resonating part, satisfies a conditional equation $0.1 \leq a/b \leq 3$. The resonating part includes the lower electrode 230, the piezoelectric layer 240, and the upper electrode 250.

If $a/b<0.1$, there is a problem in that the thickness of the shape control layer 270 is too thin, which makes it difficult to control ultra-thin film manufacturing stress in the shape control layer 270. However, if $3<a/b$, there is a problem in that flexural strength of the shape control layer 270 is large and deflection of the resonating part becomes small.

In an example, a length of the shape control layer 270 disposed over the resonating part, in other words, a length in which the resonating part and the shape control layer 270 are in contact with each other, satisfies a conditional equation $0.1 \leq c \leq 15$ μm.

If $c<0.1$ μm, there is a problem in that magnitude of a moment causing the deflection is small, and an alignment of the shape control layer 270 with the resonating part is impossible. Further, if 15 μm$<c$, there is a problem in that a size of the bulk acoustic wave resonator device 200 increases, thereby causing an increase of an overall size of the element including the bulk acoustic wave resonator device 200, and a wiring length is increased, thereby causing an increase in electrical loss. Further, if 15 μm$<c$, there is a problem in that the moment increase effect causing the deflection of the resonating part is not increased any further, and only the size of the bulk acoustic wave resonator device 200 is increased, similar to a case in which c=15 μm.

In an example, a length d of the shape control layer 270 disposed on a dummy layer outside of the resonating part satisfies a conditional equation $0.2 \leq d \leq 30$ μm.

If $d<0.2$ μm, there is a problem in that the magnitude of a moment causing the deflection is small, and alignment of the shape control layer 270 is impossible. Further, if 30 μm$<d$, there is a problem in that the size of the bulk acoustic wave resonator device 200 is increased, thereby causing an increase in the overall size of the element including the bulk acoustic wave resonator device 200, and the wiring length is increased, thereby causing an increase in electrical loss. Further, if 30 μm$<d$, there is a problem in that the moment increase effect causing the deflection of the resonating part is not increased any further, and only the size of the bulk acoustic wave resonator device 200 is increased, similar to a case in which d=30 μm.

In an example, a length e of the shape control layer 270 disposed over the cavity S (see FIG. 1) satisfies a conditional equation $0.1 \leq e \leq 15$ μm.

If $e<0.1$ μm, there is a problem in that the magnitude of the moment causing the deflection of the resonating part is small, and alignment is impossible. Further, if 15 μm$<e$, there is a problem in that the size of the bulk acoustic wave resonator device 200 is increased, to cause an increase in the overall size of the element including the bulk acoustic wave resonator device 200, and the wiring length is increased, thereby causing an increase in electrical loss. Further, if 15 μm$<e$, there is a problem in that the moment increase effect causing the deflection of the resonating part is not increased any further, and only the size of the bulk acoustic wave resonator device is increased, similar to a case in which e=15 μm.

In an example, a height B of the cavity S, which is a height of the cavity S when there is no deflection of the resonating part, and a height A of the cavity S, which is an increase in height of the cavity S when the deflection occurs, satisfy a conditional equation $0.002 \leq A/(A+B) \leq 0.8$.

If $A/(A+B)<0.002$, there is a problem in that the deflection occurrence effect is slight, and the downward deflection of the resonating part due to manufacturing stress scattering of the shape control layer 270 occurs. If $0.8<A/(A+B)$, there is a problem in that excessive stress is concentrated on an edge portion of the resonating part due to excessive deformation, thereby causing damage.

In addition, the height B of the cavity S and the height A of the cavity S satisfy a conditional equation $A/B<1.0$.

If $1.0<A/B$, there is a problem in that the excessive stress is concentrated on the edge portion of the resonating part due to the excessive deformation, thereby causing the destruction.

Further, in an example, a half C of a width of the resonating part and the height A of the cavity S when the deflection of the resonating part occurs satisfy a conditional equation $0 \leq A/C \leq 0.1$.

If $1<A/C$, there is a problem in that the excessive stress is concentrated on the edge portion of the resonating part, due to the excessive deformation, thereby causing damage.

As indicated above, reference numeral 280, illustrated in FIG. 2, indicates a dummy layer.

Hereinafter, modified examples illustrating bulk acoustic wave resonator devices will be described with reference to the accompanying drawings. However, only configurations different than those already described will be described below.

Figure 3:
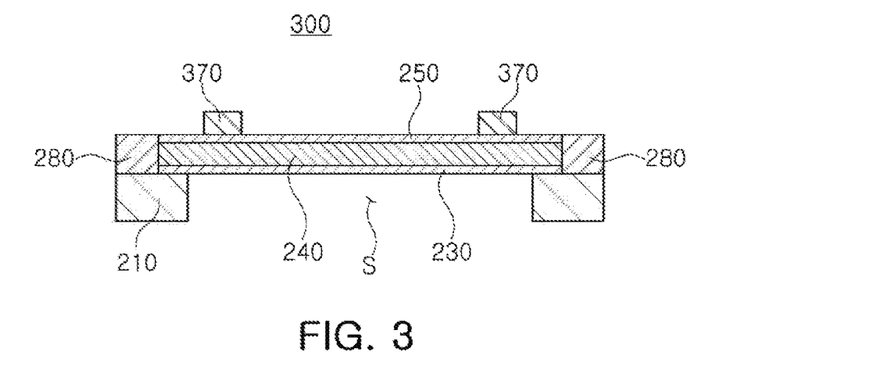
FIG. 3 is a schematic configuration view illustrating a bulk acoustic wave resonator device, according to another embodiment.

FIG. 3 is a schematic view illustrating a bulk acoustic wave resonator device 300, according to another embodiment.

Referring to FIG. 3, a shape control layer 370 is disposed over the cavity S, and an outer edge of the shape control layer 370 is spaced apart from an outer edge of the cavity S in a lateral direction transverse to the thickness direction of the resonating part. That is, the entirety of the shape control layer 370 is disposed over the cavity S. However, the outer edge of the shape control layer 370 is disposed inside an inner surface of the substrate 210 in the lateral direction.

Figure 4:
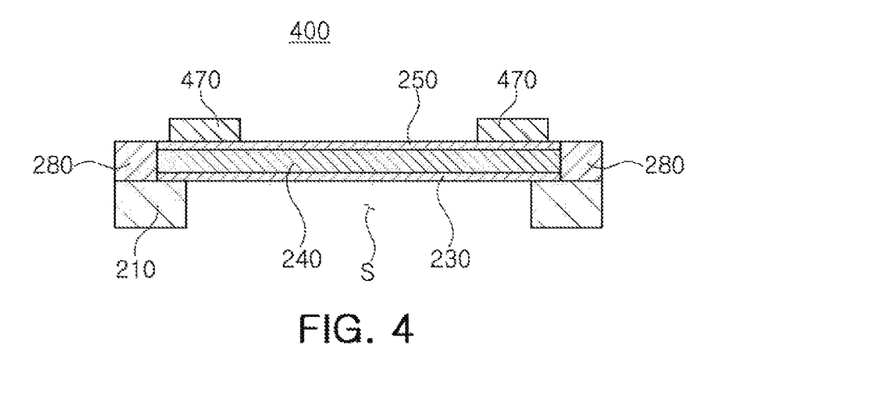
FIG. 4 is a schematic view illustrating a bulk acoustic wave resonator device, according to another embodiment.

FIG. 4 is a schematic configuration view illustrating a bulk acoustic wave resonator device 400, according to another embodiment.

Referring to FIG. 4, a portion of a shape control layer 470 is disposed over the cavity S, and a remaining portion of the shape control layer 470 is disposed outside of the upper portion of the cavity S in the lateral direction. The shape control layer 470 is disposed so as not to cover the dummy layer 280. That is, a portion of the shape control layer 470 is disposed over the cavity S, and a remaining portion of the shape control layer 470 is disposed over the substrate 210 so as to overlap the substrate 210 in the lateral direction.

Figure 5:
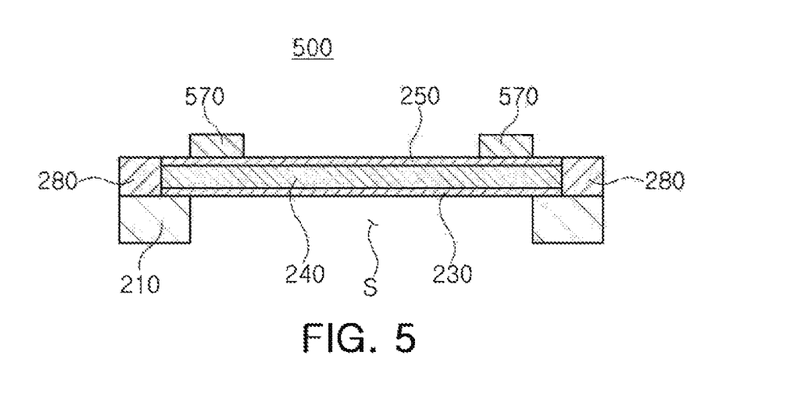
FIG. 5 is a schematic view illustrating a bulk acoustic wave resonator device, according to another embodiment.

FIG. 5 is a schematic configuration view illustrating a bulk acoustic wave resonator device 500, according to another embodiment.

Referring to FIG. 5, a shape control layer 570 is disposed over the cavity S, and an outer edge of the shape control layer 570 is disposed to be approximately aligned with the outer edge of the cavity S in the lateral direction. That is, the entirety of the shape control layer 570 is disposed over the cavity S. However, the outer edge of the shape control layer 570 is disposed to be approximately aligned with the inner surface of the substrate 210 in the lateral direction.

Figure 6:
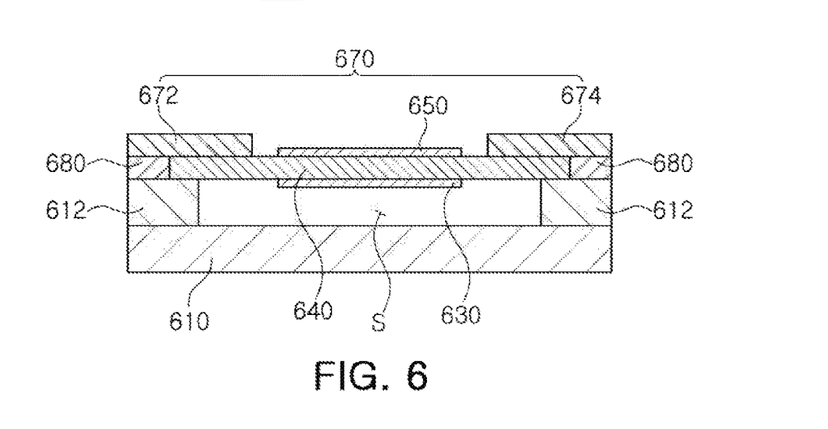
FIG. 6 is a schematic view illustrating a bulk acoustic wave resonator device, according to another embodiment.

FIG. 6 is a schematic configuration view illustrating a bulk acoustic wave resonator device 600, according to another embodiment.

Referring to FIG. 6, supporting parts 612 for forming the cavity S are formed on a substrate 610. That is, a space between the supporting parts 612 is formed as the cavity S.

A lower electrode 630 and an upper electrode 650 are disposed on a central portion of a piezoelectric layer 640. Further, a shape control layer 670 is stacked on the piezoelectric layer 640 The shape control layer 670 includes a first shape control layer 672 disposed on one side of the piezoelectric layer 640, and a second shape control layer 674 disposed on the other side of the piezoelectric layer 640.

Dummy layers 680 are disposed on the supporting parts 612, between the supporting parts 612 and the shape control layer 670.

Figure 7:
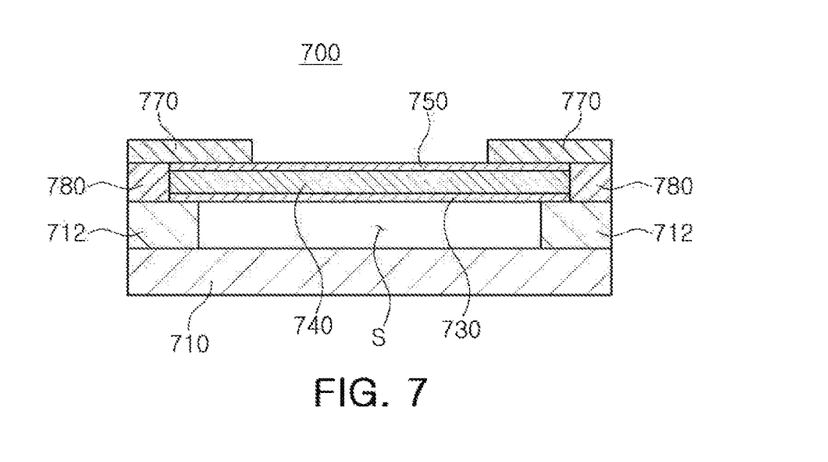
FIG. 7 is a schematic view illustrating a bulk acoustic wave resonator device, according to another embodiment.

FIG. 7 is a schematic configuration view illustrating a bulk acoustic wave resonator device 700, according to another embodiment.

Referring to FIG. 7, supporting parts 710 for forming the cavity S are formed on a substrate 712. That is, a space between the supporting parts 712 is formed as the cavity S.

In addition, a lower electrode 730 forms the cavity S together with the supporting parts 712. A piezoelectric layer 740 and an upper electrode 750 are sequentially stacked on the lower electrode 730.

In addition, dummy layers 780 are formed on edges of top surfaces of the supporting parts 712.

In addition, portions shape control layers 770 are disposed over the cavity S, and the remaining portions of the shape control layers 770 are disposed on regions outside of the cavity S in the lateral direction.

As set forth above, according to the embodiments disclosed herein, bonding between a resonating part and a substrate of a bulk acoustic wave resonator device may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator device, comprising:
   a substrate;
   a lower electrode disposed on the substrate;
   a cavity disposed between the substrate and the lower electrode;
   a piezoelectric layer covering a portion of the lower electrode;
   an upper electrode disposed on the piezoelectric layer; and
   a shape control layer at least partially disposed over an edge of the cavity,
   wherein a residual stress exists in the shape control layer.

2. The bulk acoustic wave resonator device of claim 1, wherein the shape control layer comprises any one of copper (Cu), nickel (Ni) and chromium (Cr), or a material containing any one of copper (Cu), nickel (Ni) and chromium (Cr).

3. The bulk acoustic wave resonator device of claim 2, wherein the tensile stress is applied to the shape control layer by applying heat or increasing a temperature of the substrate when the shape control layer is formed.

4. The bulk acoustic wave resonator device of claim 1, wherein the shape control layer comprises a polymer resin composite material.

5. The bulk acoustic wave resonator device of claim 4, wherein the tensile stress is applied to the shape control layer at the time of a heat treatment of either one of a drying operation and a curing operation.

6. The bulk acoustic wave resonator device of claim 1, further comprising a first layer disposed on the substrate and forming the cavity together with the substrate.

7. The bulk acoustic wave resonator device of claim 1, further comprising a protective layer covering a portion of the upper electrode.

8. The bulk acoustic wave resonator device of claim 1, wherein a portion of the shape control layer is disposed over the cavity, and remaining portions of the shape control layer are disposed outside the cavity.

9. The bulk acoustic wave resonator device of claim 1, wherein the shape control layer does not protrude outside the cavity.

10. The bulk acoustic wave resonator device of claim 9, wherein the shape control layer is disposed from a position corresponding to the edge of the cavity to a position corresponding to a central portion of the cavity.

11. The bulk acoustic wave resonator device of claim 1, wherein the shape control layer comprises a first shape control layer disposed on the lower electrode, and a second shape control layer disposed on the upper electrode.

12. The bulk acoustic wave resonator device of claim 11, wherein either one or both of the first shape control layer and the second shape control layer is disposed on a top surface of the piezoelectric layer.

13. The bulk acoustic wave resonator device of claim 1, wherein
   the substrate comprises supporting parts supporting edges of a resonating part, and
   the cavity is disposed inside the supporting parts.

14. The bulk acoustic wave resonator device of claim 1, wherein an overall thickness b of the lower electrode, the piezoelectric layer, and the upper layer, and a thickness a of the shape control layer disposed on either one or both of the upper electrode and the lower electrode satisfy a conditional equation $0.1 \leq a/b \leq 3$.

15. The bulk acoustic wave resonator device of claim 1, wherein a length c for which either one of the upper electrode and the lower electrode overlaps the shape control layer satisfies a conditional equation $0.1 \leq c \leq 15$ μm.

16. The bulk acoustic resonator device of claim 1, wherein a length d of the shape control layer disposed outside either one of the upper electrode and the lower electrode satisfies a conditional equation $0.2 \leq d \leq 30$ μm.

17. The bulk acoustic wave resonator device of claim 1, wherein a length e of the shape control layer disposed over the cavity satisfies a conditional equation $0.1 \leq e \leq 15$ μm.

18. The bulk acoustic wave resonator device of claim 1, wherein a height B of the cavity, which is a height of the cavity when there is no deflection of a resonating part of the bulk acoustic resonator device and a height A of the cavity, which is an increase in height of the cavity when a deflection of the resonating part occurs, satisfy a conditional equation $0.002 \leq A/(A+B) \leq 0.8$.

19. The bulk acoustic wave resonator device of claim 1, wherein a height B of the cavity, which is a height of the cavity when there is no deflection of a resonating part, and a height A of the cavity, which is an increase in height of the cavity when a deflection of the resonating part occurs, satisfy a conditional equation $A/B<1.0$.

20. The bulk acoustic wave resonator device of claim 1, wherein a width C of a resonating part disposed over the cavity, and a height A of the cavity, which is an increase in height of the cavity when a deflection of the resonating part occurs, satisfy a conditional equation in which $0 \leq A/C \leq 0.1$.

21. The bulk acoustic wave resonator device of claim 1, wherein the lower electrode, the piezoelectric layer, and the upper electrode deform to have an upwardly convex arch shape in response to the piezoelectric layer being deformed.

22. A bulk acoustic wave resonator device, comprising:
a substrate;
a first layer disposed on the substrate and forming a cavity together with the substrate;
a lower electrode disposed on the first layer;
a piezoelectric layer covering a portion of the lower electrode;
an upper electrode disposed on the piezoelectric layer;
a protective layer covering a portion of the upper electrode; and
a shape control layer disposed over an edge of the cavity,
wherein a residual stress exists in the shape control layer.

23. A bulk acoustic wave resonator device, comprising:
a first layer disposed on a substrate, wherein a cavity is disposed between the substrate and the first layer;
a lower electrode disposed on a portion of the first layer that partially covers the cavity;
a piezoelectric layer disposed on a portion of the lower electrode;
an upper electrode formed on the piezoelectric layer; and
a shape control layer configured to cover a portion of the lower electrode at an end portion of the cavity and cover a portion of the upper electrode at another end portion of the cavity,
wherein a residual stress exists in the shape control layer.

24. The bulk wave acoustic wave resonator device of claim 1, wherein the shape control layer is configured to cause upward deflection in corners of a resonating part during downward deflection of a central portion of the resonating part, and
wherein the resonating part comprises portions of the lower electrode, the piezoelectric layer, and the upper electrode.

* * * * *